United States Patent [19]

Tran et al.

[11] Patent Number: 4,829,362
[45] Date of Patent: May 9, 1989

[54] LEAD FRAME WITH DIE BOND FLAG FOR CERAMIC PACKAGES

[75] Inventors: Truoc T. H. Tran, Austin; James W. Sloan, Westlake Hills, both of Tex.

[73] Assignee: Motorola, Inc., Schaumburg, Ill.

[21] Appl. No.: 105,502

[22] Filed: Oct. 5, 1987

Related U.S. Application Data

[63] Continuation of Ser. No. 856,880, Apr. 28, 1986, abandoned.

[51] Int. Cl.⁴ .................................... H01L 23/48
[52] U.S. Cl. .................................... 357/70; 357/80; 437/217
[58] Field of Search .................. 357/70, 74, 80; 437/217, 220

[56] References Cited

U.S. PATENT DOCUMENTS

| 4,413,404 | 11/1983 | Burns | 357/70 |
| 4,471,158 | 9/1984 | Roberts | 174/52 EP |
| 4,514,750 | 4/1985 | Adams | 357/70 |
| 4,523,371 | 6/1985 | Wakashima | 29/588 |
| 4,527,185 | 7/1985 | Philofsky | 357/70 |
| 4,534,105 | 8/1985 | Reusch | 357/70 |
| 4,587,548 | 5/1986 | Grabbe et al. | 357/70 |

FOREIGN PATENT DOCUMENTS

| 58-169949 | 10/1983 | Japan | 357/70 |
| 1383297 | 2/1975 | United Kingdom | 357/70 |

*Primary Examiner*—Andrew J. James
*Assistant Examiner*—Mark Prenty
*Attorney, Agent, or Firm*—John A. Fisher

[57] ABSTRACT

A lead frame having a central die bond flag for ceramic integrated circuit die packages. The direct connection of the die bond flag to the lead frame via one or more leads permits direct connection of the back side or substrate of an integrated circuit die to a lead while eliminating dedicated supports that provide physical support but no electrical lead function. In a particular embodiment of the invention, a lead frame is provided whereby any of the leads may be chosen to serve as the die bond flag support/lead combination, whereby the rest of the leads are severed from connection with the die bond flag.

14 Claims, 4 Drawing Sheets

LEAD FRAME WITH DIE BOND FLAG FOR CERAMIC PACKAGES

This is a continuation of application Ser. No. 856,880, filed Apr. 28, 1986, and now abandoned.

FIELD OF THE INVENTION

The invention relates to lead frames used to attach integrated circuit die to ceramic packages and more particularly relates to lead frames for ceramic packages for integrated circuit die requiring an electrical connection to the backside or substrate of the die.

BACKGROUND OF THE INVENTION

In the art of assembling integrated circuit die into packages that can be handled and placed into printed circuit boards by the customer, it has long been the practice to use a lead frame, which is a frame of leads that encircles the die to which the bonding pads on the die are electrically connected. In addition, integrated circuit packaging has traditionally been divided into two groups, ceramic packages which may be hermetically sealed by the flowing of glass between a ceramic base and cap, which surround the die, and plastic packages in which the die is first physically and then electrically bonded to the lead frame, which is then suspended in a mold and the plastic package material is injection molded around the die. The plastic package is not hermetic and does not protect the die as well as the ceramic package does.

In ceramic package assembly, the lead frames have an opening or hole in the center of the lead frame for receiving the die and through which wire bond connections to the bonding pads on the surface of the die are passed. The die and the proximal portions of the leads closest to the die are encased in a ceramic package, leaving the distal portions of the leads, which radiate out away from the die area and form the distal package leads or pins exposed to be inserted into holes on a printed circuit board for connection with the rest of the circuit. Usually the distal ends of the leads are connected to each other and held in fixed position relative to one another by means of an encircling rectangular frame or boundary which is severed after encasement, but prior to insertion in a printed circuit board.

In the assembly of ceramic integrated circuit packages, the integrated circuit die is first mounted on a physical support such as a shallow cavity in the bottom of a ceramic package base. To keep the die in a fixed position relative to the proximal ends of the leads of the lead frame, the die is secured into place in the cavity of the ceramic package base and the lead frame is fixed into the ceramic package base by melting a thin layer of glass on the top surface of the base. The lead frame is positioned such that the hole in the center of the leads frames or surrounds the die. Usually the assembly of base, lead frame and die is designed so that the bonding pads of the die are at about the same level or slightly below the level of the proximal ends of the leads. Next, the leads of the lead frame are connected to the bonding pads on the integrated circuit die by wire bonding.

Often, besides the bonding pads on the top side of the integrated circuit die, the bottom side of the die, also called the back side of the substrate, must be electrically connected to be properly grounded or back-biased so that the chip will function properly. It is efficient to electrically connect both the top surface bonding pad and the substrate backside together in some fashion so that only one of the leads and one of the pins need be dedicated to this electrical connection.

In ceramic packages, the hollow or shallow cavity in the ceramic base portion is filled with a gold frit material or some other conductive material and a lead must somehow be connected to this surface which is in electrical contact with the back side of the chip. The most direct way of making this connection is to "down bond" a wire directly from a lead to the gold frit surface. However, if aluminum wire is used, the gold/aluminum bond tends to be unreliable. Also, the bonding of the die to the gold frit surface tends to form a region of gold/silicon alloy around the chip which must be avoided if a good wire bond is to be made. In many cases, the region of gold/silicon alloy will be extensive enought to make it physically difficult to avoid it and make the downbond wire connection. Of course, once the downbond connection is made from the bonding pad or the lead, another wire bond connection is made to the lead or to the bonding pad, repsectively, depending on what element remains electrically unconnected to the common lead.

One common way of making this backside connection in a ceramic package is to use a bonding island. The die cavity or shallow compartment in the ceramic base is designed to be somewhat larger than the actual die size permitting room for a tiny piece of conductive silicon to also be bonded on the gold frit or other conductive material, next to the chip as a separate "island". Then the bonding pad on the surface of the chip is wire bonded to the island, which is in electrical connection to the backside of the chip via the gold frit material, the island in turn being wire bonded to the appropriate lead of the lead frame. Or the lead may have two wire bond connections, one to the bonding island and one to the bonding pad. One advantage of using a bonding island is that the island does not have to avoid the gold-silicon alloy region as do aluminum downbond wires. Often more than one bonding pad on the top surface of the chip needs to be grounded or have the same signal as the backside and the package assembly will two or more bonding islands. For an example of the use of a bonding island, see U.S. Pat. No. 4,558,436.

However, down bond islands have the disadvantages of having to separately fabricate and mount each island, which add extra expense and steps to the assembly process. One of the major disadvantages of conventional ceramic packaging is that the assemblies just described do not lend themselves to processing strips of lead frames in a continuous process. Rather, each package must be assembled individually in a "one-up" fashion which is very time consuming.

It is generally accepted by those skilled in the art that teachings for one form of assembly, namely plastic packages, cannot be transferred to the ceramic packaging art. Plastic packaging art will now be discussed for the purpose of contrast.

In the plastic packaging art, die bond flags, which are integral parts of the lead frame, are used to support the integrated circuit chip prior to wire bonding the surrounding leads to the bonding pads on the semiconductor chip. This separate support is necessary since packaging material is not provided in discrete pieces as in ceramic packages, but is instead in pellet form, prior to injection molding around the wire bonded die/lead frame assembly. In the typical case, the die bond flag is held in its position relative to the ends of the leads of the lead frame by separate bars or supports whose sole purpose is to support and hold the die bond flag in proper position. After the die and proximal portions of the leads are encapsulated in plastic, the supports are severed from the boundary around the lead frame and the supports no longer function since the die bond flag is now held fixed by the plastic. For an example of a typical lead frame, see U.S. Pat. No. 4,523,371 to Wakashima.

Philofsky, et al. in U.S. Pat. No. 4,527,185 have developed the lead frame assembly 10 shown in FIG. 1 for plastic packages. Lead frame assembly 10 is composed of lead frame 12 having a plurality of leads 14 with distal ends 16 oriented around the outside periphery of the frame 12 and connected to rectangular holding frame 18 and proximal ends 20 oriented toward the center of lead frame 12. Philofsky, et al.'s lead frame 12 does not have a central die bond flag, as discussed above, however, there are two die support and power supply leads 22 which have distal ends 16, but instead of proximal ends 20, terminate instead in shunting capacitor holding brackets 24. The two shunting capacitor holding brackets 24 are not physically or electrically connected to one another, but are bridged by shunting capacitor 26 which forms the physical support for integrated circuit die 28. Die 28 must have some electrical connection to power supply leads 22, such as wire bonds 30, and of course, one of these connections is the ground. While the Philofsky, et al. design helps minimize the number of leads by using the two power supply leads as two support leads and makes the shunting capcaitor much more compact and brings it inside the package, there is no provision for or recognition of the need for a backside or substrate ground or bias connection, which would be particularly difficult since the integrated circuit die is mounted on the side of shunt capacitor 24.

In U.S. Pat. No. 4,514,750, Adams teaches a lead frame that removes the need for "flying leads", which are the shorter sides of outermost rectangle 18 holding the digital ends 16 of the leads 18 in FIG. 1. Adams' lead frame assembly 32, depicted in FIG. 2 has all of the vertically oriented pieces of metal as active metal leads 34 which possess proximal ends 36 and distal ends 38 held in a fixed position relative to each other by outside rectangle 40. Outside rectangle 40 has two short sides, the bulk of which will be used as leads, although the longer sides will be severed from the distal ends 38 of leads 34. Thus by Adams' design, very little metal is wasted. Another unusual feature of the Adams lead frame assembly 32 is that the lead frame provides a die bond flag 42 for a ceramic, hermetic chip package.

The Adams lead frame assembly 32 does have a die bond flag 42 in the center of the lead frame assembly 32 toward which the proximal ends 36 of the leads 34 point. Like many common lead frame designs, such as U.S. Pat. No. 4,523,371 to Wakashima, Adams' die bond flag is physically supported from the outside rectangle 40 by two separate, dedicated flag supports 44, which are severed at nibs 46 after package assembly via niches in the package body. However, a special grounded lead 48 is disclosed by Adams, that is connected to one of the supports 44 via grounding conection 50. Thus, integrated circuit die 52 of Adams, may have its backside or bottom substrate grounded via physical and electrical connection to die bond flag 42, and a top die surface bond pad bonded via wire bond 54 to the proximal end 56 of ground lead 48 which is joined to the die bond flag by connection 50. Thus, while Adams solves the problem of grounding or back biasing the bottom of the die 52 unlike Philofsky, et al., One skilled in the art does not find from Adams a teaching of minimizing the number of leads, since essentially three structures, the two supports 44 and the ground lead 48 serve the functions of support and electrical connection, respectively.

It would be a desirable advance in the art if a lead frame for ceramic integrated circuit chip packages were discovered which could combine the advantages of Philofsky, et al. and Adams without the disadvantages left by each.

SUMMARY OF THE INVENTION

Accordingly, it is an object of the present invention to provide a ceramic package for an integrated circuit chip with a lead frame having a die bond flag that permits direct physical and electrical connection of the back or substrate side of an integrated circuit die to the die bond flag.

It is another object of the innvention to provide a lead frame for a ceramic integrated circuit package, where the lead frame has no special or dedicated supports for the die bond flag, and the structures that support the die bond flag also serve as electrical leads.

It is another object of the present innvention to provide a lead frame with a die bond flag that permits both the substrate side of the die and a bonding pad on the front or top side of the die to be electrically connected in a common lead with a minimum of structure and extra assembly cost.

Still another object of the invention is to provide an integrated circuit package having a electrical connection between a die bond flag and top surface bonding pad without necessity for a bonding island or downbond wire.

Yet another object is to provide a lead frame that would be compatible with continuous "strip" automated assembly.

It is still another object of the present invention to provide a lead frame that permits any of the leads to serve as the die bond flag support and substrate backside contact lead as required thereby providing lead frame design versatility.

In carrying out these and other objects of the invention, there is provided, in one form, an integrated circuit die ceramic package together with a lead frame for attachment to an integrated circuit die having a die bond flag and a plurality of leads having distal and proximal ends surrounding the die bond flag. Also present are individually severable connections between the die bond flag and the leads which may be individually selected to serve simultaneously as support and electrical contact leads.

DETAILED DESCRIPTION OF THE INVENTION

Figure 3:
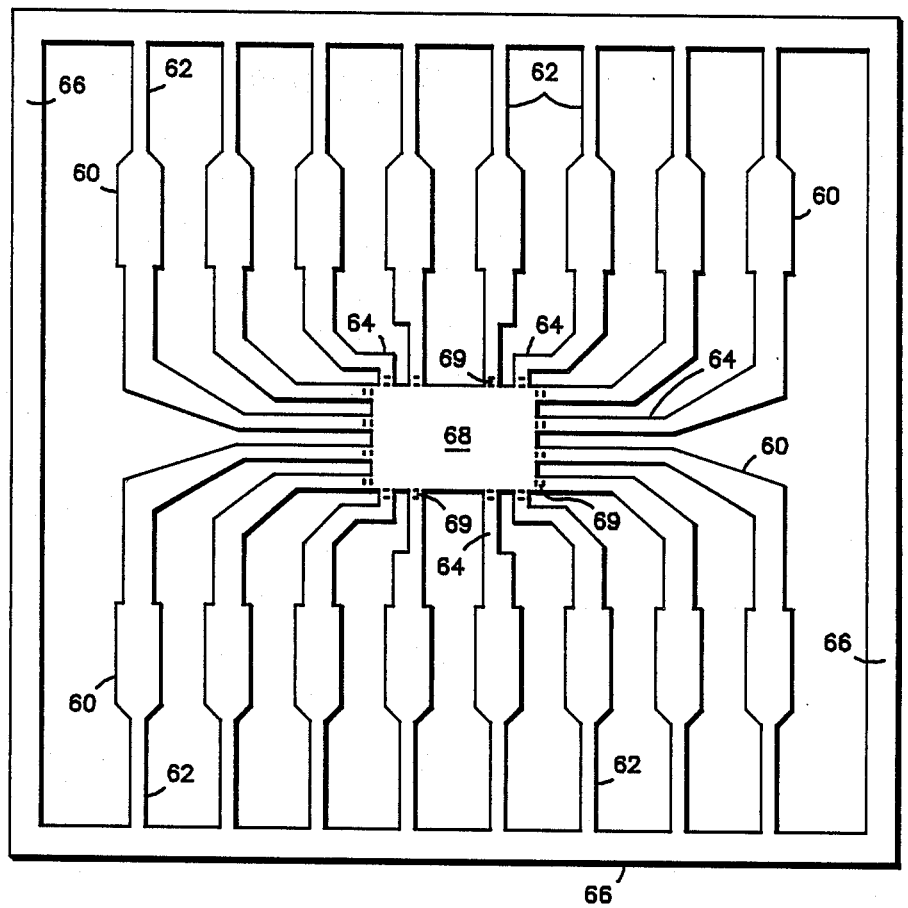
FIG. 3 is a schematic plan view of one embodiment of the lead frame of this invention before any of the leads are severed.

Shown in FIG. 3 is the lead frame 58 of the instant invention having a plurality of leads 60 each having a distal end 62 and a proximal end 64, the distal ends 62 being oriented around the periphery of the lead frame 58 and held together in a fixed, spaced-apart relationship by rectangular boundary 66 after the package is assembled.

Proximal ends 64 are oriented toward the center of the lead frame 58 and are physically and electrically connected to die bond flag 68 via severable connections 69. Severable connections 69 may simply be that part of the proximal end 64 of lead 60 next to the die bond flag 68 that may be severed or eliminated to isolate the die bond flag 68 from the lead 60. Or in an alterate embodiment, severable connection 69 may be a notch or a regionn of a thinner section of lead 60 permitting the severing operation to be easily accomplished. In any event, each of the leads 60 is provided with a severable connection 69 to the die bond flag 68. The severable connections 69 must, however, remain intact if they are not deliberately severed.

By the means just described, any of the leads 60, including one or more than one could be selected to physically support and electrically connect die bond flag 68 (and the back or substrate side of the die to be mounted thereon) to the desired outside or distal lead or pin 62.

Figure 4:
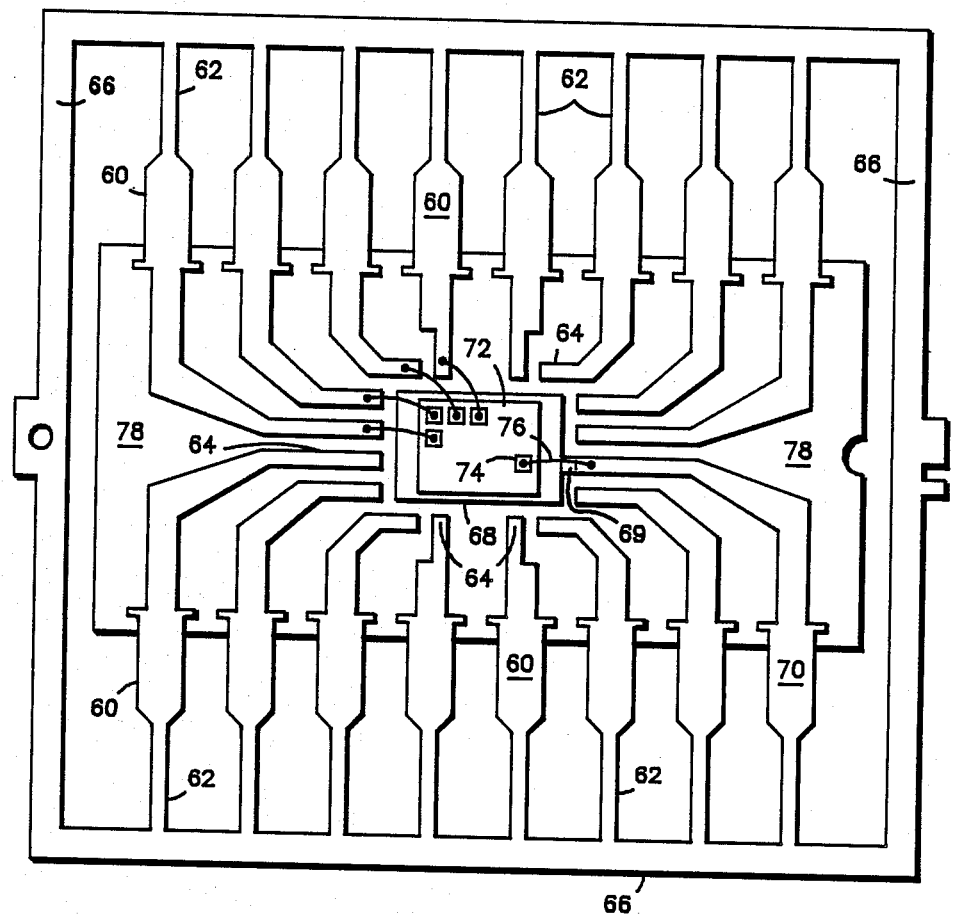
FIG. 4 is a schematic plan view of one embodiment of the lead frame assembly of the present invention.

Shown in FIG. 4 is the lead frame 58 after all but one of the severable connections 69 have been broken, and the die bond flag 68 remains attached to only one lead 70 which may be a ground lead or a lead with another signal thereon. Lead 70 is identical to leads 60 except that it solely physically supports and is electrically connected to die bond flag 68 and an integrated circuit die 72 mounted thereon.

Figure 1:
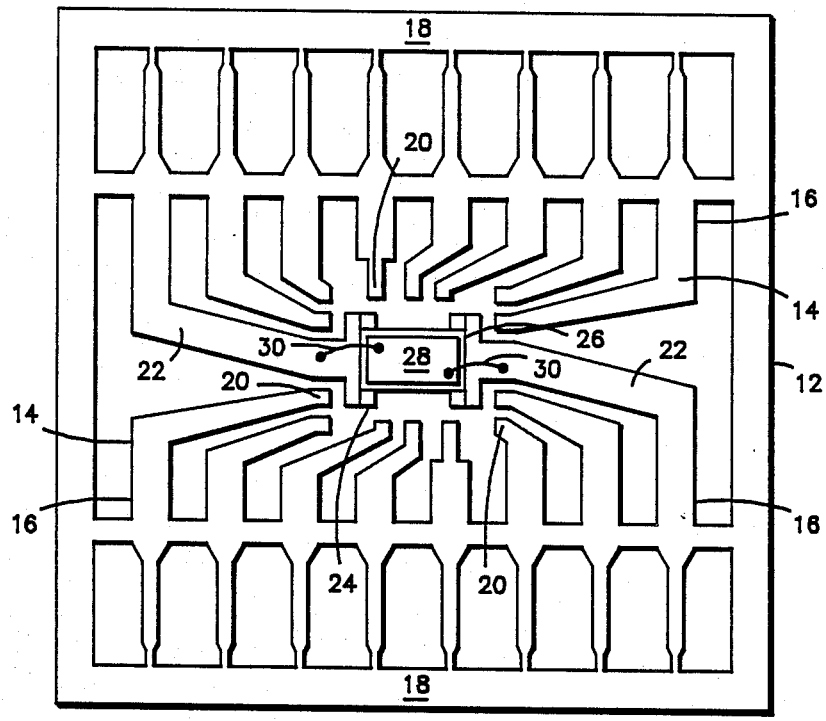
FIG. 1 is a schematic plan view of a prior art lead frame assembly.
Figure 2:
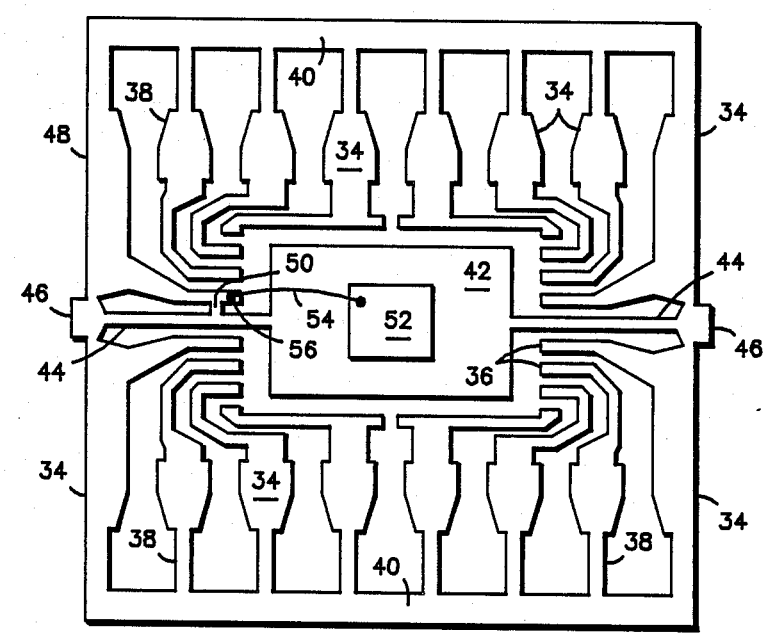
FIG. 2 is a schematic plan view of a second prior art lead frame assembly.

In the illustration in FIG. 4, the back side or substrate side of integrated circuit die 72 is now physically supported and electrically connected to die bond flag 68 and lead 70. Also, bonding pad 74, not shown to scale, may also be connected to the same lead 70 via wire bond 76. Recall that in the prior art lead frame of FIG. 2, this wire bond connection would be to a lead separate from the supports 44.

Of course, the engineer is free to choose more than one lead 60 to become lead 70 to support and be connected to die bond flag 68. In many instances only one bonding pad 74 will also have to be connected to the same source or signal as the substrate, in which case only one severable connection 69 remains and only one lead 60 becomes a lead 70, but in many other cases, two or more surface bonding pads 74 will also have to be connected to the same lead 70 as the substrate. Another advantage of the lead frame 58 of the present invention is that the wire bond 76 from the bonding pad 74 to the lead 70 may be made anywhere along the lead 70 surface and is not limited to a very small cavity area which has been greatly narrowed by the formation of gold-silicon alloy regions which is a problem in conventional ceramic lead frame assemblies where a down bond wire is used.

Also shown in FIG. 4 is the outline of the base package portion 78 compared against the lead frame 58 to demonstrate which parts of leads 60 will be encased within the package and which will remain outside, the latter being only the distal lead ends 62 and rectangular boundary 66.

Figure 5:
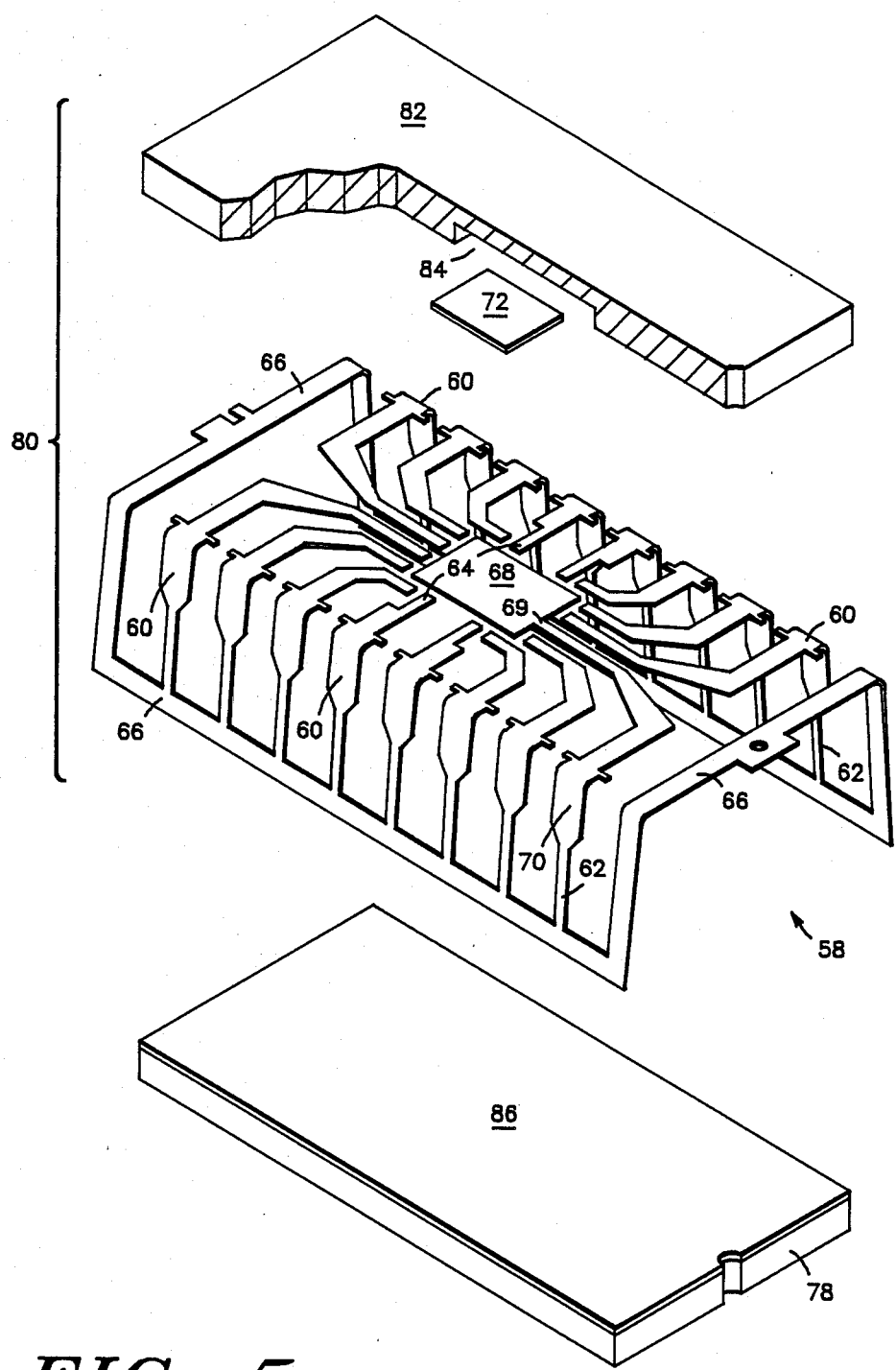
FIG. 5 is a three-quarters exploded perspective view of a ceramic package having the lead frame assembly of the instant invention.

Shown in FIG. 5 is an exploded view of the entire integrated circuit package 80 showing its various parts. Lead frame 58 is shown after the distal ends 62 of the leads 60 have been bent down in the shape they will have after assembly. In most instances, it will be desired to bond integrated circuit die 72 to the die bond flag 68 and make the appropriate wire bond connections 76 before the lead bending step. This sequence then permits the lead frames to be strip processed or continuously handled rather than in a one-up, individual assembly process flow. It may also be desired to bond base package portion 78 to the lead frame 58 at any convenient stage in this process, such as before the leads 60 are bent. Cap package portion 82, provided with clearance recess 84 to permit room for the die 72 in the package, may be placed on top of the lead frame 58 at any time after all of the wire bond connections 76 are complete and the base package portion 78 is in place. The particular type of package 80 shown in FIG. 5 having a base package portion 78 and a cap package portion 82 is typical of a hermetic ceramic package where both portions 78 and 82 are of ceramic material and are adhered together around the lead frame 58 in a heat seal operation that melts the sealing glass layer 86 on base portion 78 to embed the lead frame 58 into the package structure.

Rectangular boundary 66 is left on the package 80 to protect the distal ends 62 of the leads 60 from becoming bent improperly during handling. However, boundary 66 is cut away prior to device testing and customer delivery.

The lead frame 58, lead frame assembly and integrated circuit package 80 of this invention thereby provide a built-in electrical connectionn between the die bond flag support lead 70 and die 72 substrate without necessity for a bonding island or die bond wire. Additionally, since the lead frame may be processed rapidly in strip form, the lead frame of this invention allows the lead frame embed step, that is embedding lead frame 58 into base package portion 78 and cap package portion 82 to be done with one operation. Thus, the lead frame 58 of this invention is more adaptable to automated processing as compared with other ceramic packaging assembly techniques. Of course, single, one-at-a-time packaging methods could still be applied to lead frame 58. The lead frame 58 of this invention also permits eutectic die bonding to be done on the lead frame 58 only (rather than the base package portion 78 plus lead frame 58 as in some assembly flows) to reduce the assembly preheating requirement. In addition, heat cycling of the base sealing glass to the seal or cap portion 82 may also be reduced.

Of course, one main advantage of the present invention is that the lead frame is adaptable to more than one particular lead configuration in that the assembly engineer may easily change which lead or leads 70 will provide the physical support and electrical connection to the die bond flag 68.

We claim:

1. An integrated circuit die ceramic package comprising:
    a lead frame comprising:
        a plurality of leads each having a proximal end and a distal end, the distal ends oriented around the periphery of the lead frame and the proximal ends connected to a die bond flag in the center portion of the lead frame, each proximal end of a lead being connected to the die bond flag at a severable connection;

wherein any of the leads, but at least one of the leads is selected to simultaneously serve as mechanical support of and electrical connection to the die bond flag; and wherein a plurality of the remainder of the leads are severed from the die bond flag at the severable connections;

wherein the selection of leads to serve simultaneously as mechanical support and electrical connection is not predetermined at the time of manufacture of the lead frame;

an integrated circuit die mounted on the die bond flag, wherein the integrated circuit has a plurality of bonding pads on its exposed surface;

a plurality of wire bonds from the integrated circuit die to the lead frame, each wire bond connecting one bonding pad of the integrated circuit die to one lead via its proximal end; and a ceramic package enclosure hermetically encapsulating the integrated circuit die, die bond flag and proximal ends of the leads, leaving the distal ends of the leads outside the package enclosure.

2. An integrated circuit die ceramic package, a lead frame assembly comprising:

a lead frame comprising:

a plurality of leads each having a proximal end and a distal end, the distal ends oriented around the periphery of the lead frame and the proximal ends connected to a die bond flag in the center portion of the lead frame;

wherein any of the leads, but at least one of the leads is selected to simultaneously serve as mechanical support of and electrical connectionn to the die bond flag; and wherein a plurality of the remainder of the leads are severed from the die bond flag at the severable connections;

wherein the selection of leads to serve simultaneously as mechanical support and electrical connection is not predetermined at the time of manufacture of the lead frame;

an integrated circuit die physically mounted on the die bond flag, wherein the integrated circuit has a top surface and a bottom surface, a plurality of bonding pads on its top surface and a substrate contact on its bottom surface in electrical contact with the die bond flag; and a plurality of wire bonds from the integrated circuit die to the lead frame, each wire bond connecting one bonding pad of the integrated circuit die to one lead via its proximal end.

3. The integrated circuit die ceramic package of claim 2 wherein the distal ends of the leads are severably connected and held in place relative to each other by a lead support boundary.

4. The integrated circuit die ceramic package of claim 2 wherein all of the severable connections but one are severed.

5. An integrated circuit die ceramic package comprising:

a lead frame comprising:

a plurality of leads each having a proximal end and a distal end, the distal ends oriented around the periphery of the lead frame and the proximal ends connected to a die bond flag in the center portion of the lead frame, wherein each lead is connected to the die bond flag via a severable connection and a lead support boundary connecting and holding in place the distal ends of the leads relative to each other wherein the lead support boundary is severable from the distal ends;

wherein any of the leads, but at least one of the leads remains attached to the die bond flag by its proximal end, serving simultaneously as a lead and as a single support for the die bond flag; and wherein a plurality of the remainder of the leads are severed from the die bond flag at the severable connections;

wherein the selection of leads to serve simultaneously as mechanical support and electrical connection is not predetermined at the time of manufacture of the lead frame;

an integrated circuit die physically mounted on the die bond flag, wherein the integrated circuit has a top surface and a bottom surface, a plurality of bonding pads on its top surface and a substrate contact;

a plurality of wire bonds from the integrated circuit die to the lead frame, each wire bond connecting one bonding pad of the integrated circuit die to one lead via its proximal end; and a ceramic package enclosure hermetically encapsulating the integrated circuit die, die bond flag and proximal ends of the leads, leaving the distal ends of the leads outside the package enclosure.

6. The integrated circuit die ceramic package of claim 5 wherein the ceramic package enclosure comprises a base portion and a cap portion that surround and encase the lead frame and integrated circuit die.

7. The integrated circuit die ceramic package of claim 5 wherein the base portion and cap portion are bonded around the lead frame and integrated circuit die by means of a reflowable sealing glass.

8. The integrated circuit die ceramic package of claim 5 wherein all of the severable connections but one are severed.

9. In an integrated circuit die ceramic package, a lead frame for attachment to an integrated circuit die comprising:

a plurality of leads having distal and proximal ends and a die bond flag integrally joined to the proximal ends of the leads at individually severable joints, thereby providing a lead frame having a die bond flag supported in relative position to the leads by any one of the leads, but at least one individually selected lead simultaneously serving as mechanical support of and electrical connection to the die bond flag maintaining its severable joint thereto, and where a plurality of other leads are severed from the die bond flag at their severable connections, wherein the individual selection is not predetermined at the time of manufacture of the lead frame.

10. The integrated circuit die ceramic package of claim 9 wherein the die bond flag is centrally located within the lead frame.

11. The integrated circuit die ceramic package of claim 9 wherein a lead support boundary joins the distal ends of the leads at severable connections.

12. An integrated circuit die ceramic package comprising:
a lead frame for attachment to an integrated circuit die comprising:
a plurality of leads having distal and proximal ends in a common plane with
a die bond flag integrally joined to the proximal ends of the leads by individually severable connections;
wherein any of the leads, but at least one of the leads is selected to simultaneously serve as mechanical support of and electrical connection to the die bond flag by maintaining its severable connection thereto; and
wherein a plurality of other leads are severed from the die bond flag at their severable connections;
an integrated circuit die mechanically and electrically mounted on the die bond flag, the integrated circuit having a plurality of bonding pads individually wire bonded to the proximal ends of the leads; and
a ceramic package entirely encasing the integrated circuit die, die bond flag and the proximal ends of the leads, leaving the distal ends of the leads exposed.

13. The integrated cirucit die ceramic package of claim 12 wherein the die bond pad is centrally located within the lead frame.

14. The integrated circuit die ceramic package of claim 12 wherein all of the severable connections but one are severed.

* * * * *